(12) United States Patent
Holmes et al.

(10) Patent No.: US 9,979,356 B2
(45) Date of Patent: May 22, 2018

(54) MAGNETICALLY COUPLED LOAD MODULATION

(71) Applicants: Damon G. Holmes, Scottsdale, AZ (US); Ramanujam Srinidhi Embar, Gilbert, AZ (US); Joseph Staudinger, Gilbert, AZ (US); Michael E. Watts, Scottsdale, AZ (US)

(72) Inventors: Damon G. Holmes, Scottsdale, AZ (US); Ramanujam Srinidhi Embar, Gilbert, AZ (US); Joseph Staudinger, Gilbert, AZ (US); Michael E. Watts, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 714 days.

(21) Appl. No.: 14/573,927

(22) Filed: Dec. 17, 2014

(65) Prior Publication Data
US 2016/0181992 A1  Jun. 23, 2016

(51) Int. Cl.
| *H03F 1/08* | (2006.01) |
| *H03F 1/02* | (2006.01) |
| *H03F 3/195* | (2006.01) |

(52) U.S. Cl.
CPC ........... *H03F 1/083* (2013.01); *H03F 1/0288* (2013.01); *H03F 3/195* (2013.01); *H03F 2200/451* (2013.01); *H03F 2200/537* (2013.01); *H03F 2200/541* (2013.01)

(58) Field of Classification Search
CPC ........................................................ H03F 1/08
USPC ............................................. 330/124 R, 295
See application file for complete search history.

(56) References Cited

U.S. PATENT DOCUMENTS

| 4,379,341 | A | 4/1983 | Toyooka et al. |
| 4,686,492 | A | 8/1987 | Grellmann et al. |
| 4,894,619 | A | 1/1990 | Leinonen et al. |
| 5,004,317 | A | 4/1991 | Jackson et al. |
| 7,061,329 | B2 | 6/2006 | Inoue et al. |
| 7,106,070 | B2 | 9/2006 | Bertness et al. |
| 7,262,656 | B2 | 8/2007 | Shiikuma |
| 7,295,074 | B2 * | 11/2007 | Wong .................. H03F 1/0288 330/124 R |

(Continued)

FOREIGN PATENT DOCUMENTS

WO    20040088837 A2    10/2004

OTHER PUBLICATIONS

Notice of Allowance dated Dec. 22, 2016 for U.S. Appl. No. 14/211,410, 9 pages.

(Continued)

*Primary Examiner* — Patricia T Nguyen

(57) ABSTRACT

A method, packaged semiconductor device, and system for controlling a secondary amplifier output current based on an input signal received from an amplifier input, converting electrical energy to magnetic energy at a secondary amplifier output inductor, coupling the magnetic energy from the secondary amplifier output inductor to a primary amplifier output inductor, converting the coupled magnetic energy to induced electrical energy at the primary amplifier output inductor, combining the induced electrical energy with output electrical energy from a primary amplifier gain element, and applying a combined electrical energy including the output electrical energy and the induced electrical energy to a primary amplifier load are provided.

19 Claims, 6 Drawing Sheets

(56) References Cited

U.S. PATENT DOCUMENTS

| | | | |
|---|---|---|---|
| 7,362,170 B2 | 4/2008 | Louis | |
| 7,874,878 B2 | 1/2011 | Fite et al. | |
| 8,030,763 B2 | 10/2011 | Romero et al. | |
| 8,110,932 B2 | 2/2012 | Sjoestroem | |
| 8,659,359 B2 | 2/2014 | Ladhani et al. | |
| 9,319,008 B2* | 4/2016 | Ikriannikov | B06B 1/0261 |
| 9,604,254 B2* | 3/2017 | Brubaker | B06B 1/0261 |
| 2005/0040796 A1* | 2/2005 | Sutardja | H02M 3/157 |
| | | | 323/247 |
| 2005/0087856 A1 | 4/2005 | Joiner et al. | |
| 2007/0235855 A1 | 10/2007 | Bokatius et al. | |
| 2009/0273397 A1* | 11/2009 | Bockelman | H03F 1/0277 |
| | | | 330/51 |
| 2011/0298535 A1 | 12/2011 | Van Rijs et al. | |
| 2012/0313707 A1 | 12/2012 | Heid | |
| 2014/0070365 A1 | 3/2014 | Viswanathan et al. | |
| 2014/0167855 A1 | 6/2014 | Ladhani et al. | |
| 2014/0167863 A1 | 6/2014 | Ladhani et al. | |
| 2017/0077877 A1* | 3/2017 | Anderson | B82Y 10/00 |

OTHER PUBLICATIONS

Non-Final Office Action dated Jun. 2, 2016 for U.S. Appl. No. 14/211,410, 6 pages.

Peng et al.; "A Highly Efficient Interleaved DC-DC Converter using Coupled Inductors in GaAs Technology"; IEEE Circuits and Systems, 2009; pp. 1105-1108.

Doherty, W.H.; "A New High-Efficiency Power Amplifier for Modulated Waves"; Proceedings of Annual Convention of the Institute of Radio Engineers; May 11-13, 1936; pp. 469-474.

Dal Fabbro, P.A. et a., "RF Power Amplifier Employing a Frequency-Tunable Impedance Matching Network Based on Coupled Inductors"; IEEE Electronics Letters, vol. 44, issue 19; Sep. 11, 2008, pp. 1131-1132.

U.S. Appl. No. 14/211,410, filed Mar. 14, 2014, entitled "Multi-Path Devices With Mutual Inductance Compensation Networks and Methods Thereof".

Notice of Allowance dated Jun. 20, 2011 for U.S. Appl. No. 12/147,313, 10 pages.

Non-Final Office Action dated Oct. 20, 2015 for U.S. Appl. No. 14/211,410, 7 pages.

* cited by examiner

MAGNETICALLY COUPLED LOAD MODULATION

CROSS-REFERENCE TO RELATED APPLICATION(S)

The present application is related to co-pending U.S. patent application Ser. No. 14/211,410, entitled "MULTI-PATH DEVICES WITH MUTUAL INDUCTANCE COMPENSATION NETWORKS AND METHODS THEREOF" filed on Mar. 14, 2014.

BACKGROUND

Field of the Disclosure

The present disclosure relates to radio frequency (RF) circuits and, more particularly, to magnetic coupling between paths in RF circuits.

Background

RF circuits are typically designed with certain impedance expectations. For example, an RF amplifier is typically designed to transfer power into a load having a suitable impedance. With more complicated RF circuit architectures, more complicated modulation waveforms, and more complicated operating modes, traditional approaches to RF circuit design can limit performance. For example, parasitic inductances of interconnects can result in signal degradation due to poor path-to-path isolation.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A method, packaged semiconductor device, and system uses magnetic coupling of amplifier outputs to provide load modulation. The magnetic coupling can be configured to provide an impedance inverter. The impedance inverter can combine the amplifier outputs so they are out of phase with each other. A secondary amplifier output current is controlled based on an input signal received from an amplifier input. Electrical energy is converted to magnetic energy at a secondary amplifier output inductor. The magnetic energy is coupled from the secondary amplifier output inductor to a primary amplifier output inductor. The coupled magnetic energy is converted to induced electrical energy at the primary amplifier output inductor. The induced electrical energy is combined with output electrical energy from a primary amplifier gain element. A combined electrical energy including the output electrical energy and the induced electrical energy is applied to a primary amplifier load. A primary amplifier load impedance of the primary amplifier load can be modulated as a function of the induced electrical energy. The converting of electrical energy to magnetic energy at the secondary amplifier output inductor can provide impedance inversion of a secondary amplifier load impedance of a secondary amplifier gain element. The combining of induced electrical energy with the output electrical energy from the primary amplifier can include combining the induced electrical energy with the output electrical energy output without a quarter-wave combiner, wherein a Doherty amplifier includes a primary amplifier gain element outputting the output electrical energy and a second amplifier gain element outputting the output electrical energy.

Figure 1:
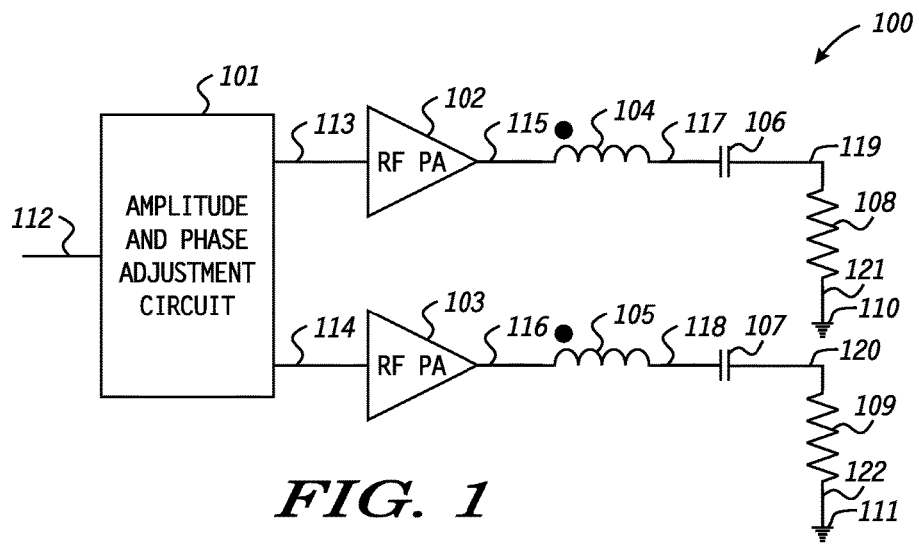
FIG. 1 is a schematic diagram illustrating a RF circuit for magnetically coupled load modulation in accordance with an embodiment.

FIG. 1 is a schematic diagram illustrating a RF circuit for magnetically coupled load modulation in accordance with an embodiment. RF circuit 100 includes an amplitude and phase adjustment circuit 101, a RF power amplifier (PA) 102, a RF PA 103, an inductor 104, an inductor 105, a capacitor 106, a capacitor 107, a load 108, and a load 109. An input signal to be amplified is provided to an amplifier input 112, at the input to amplitude and phase adjustment circuit 101. Amplitude and phase adjustment circuit 101 adjusts the amplitude and phase of the input signal to provide a first amplifier input signal at a first amplifier input 113 of desired amplitude and phase and a second amplifier input signal at a second amplifier input 114 of desired amplitude and phase. The first amplifier input 113 is connected to an input of first RF PA 102 to provide the first amplifier input signal to first RF PA 102. The second amplifier input 114 is connected to an input of second RF PA 103 to provide the second amplifier input signal to second RF PA 103.

First RF PA 102 amplifies the first amplifier input signal to provide a first amplifier output signal at first amplifier output 115. Second RF PA 103 amplifies the second amplifier input signal to provide a second amplifier output signal at second amplifier output 116. First amplifier output 115 is connected to a first terminal of a first amplifier output inductor 104. Second amplifier output 116 is connected to a first terminal of a second amplifier output inductor 105. A second terminal of first amplifier output inductor 104 is connected to a first terminal of a first capacitor 106 at node 117. A second terminal of second amplifier output inductor 105 is connected to a first terminal of a second capacitor 107 at node 118. A second terminal of first capacitor 106 is connected to a first terminal of a first load 108 at node 119. A second terminal of second capacitor 107 is connected to a first terminal of a second load 109 at node 120. A second terminal of first load 108 is connected to ground 110 at node 121. A second terminal of second load 109 is connected to ground 111 at node 122.

While first capacitor 106 is shown as being after first amplifier output inductor 104 in the first signal path from first RF PA 102 and second capacitor 107 is shown as being after second amplifier output inductor 105 in the second signal path from second RF PA 103, it should be noted that first amplifier output inductor 104, first capacitor 106, and first load 108 form a series resistance, inductance, and capacitance (RLC) circuit, where the order in which the resistance, the inductance, and the capacitance appear may be rearranged, and second amplifier output inductor 105, second capacitor 107, and second load 109 form a series RLC circuit, wherein the order of in which the resistance, the inductance, and the capacitance appear may be rearranged.

While first load 108 and second load 109 are shown as being a resistors, first load 108 and second load 109 may be implemented as other elements exhibiting appropriate load impedances. The impedance of second load 109 may be the same as the impedance of first load 108, or the impedance of second load 109 may be different from the impedance of first load 108. For example, the impedance of second load 109 may be any appropriate value from zero to infinity. In accordance with one example, second load 109 may be implemented using a quarter-wave transmission line or a transmission line of another length relative to a wavelength of operation.

Figure 2:
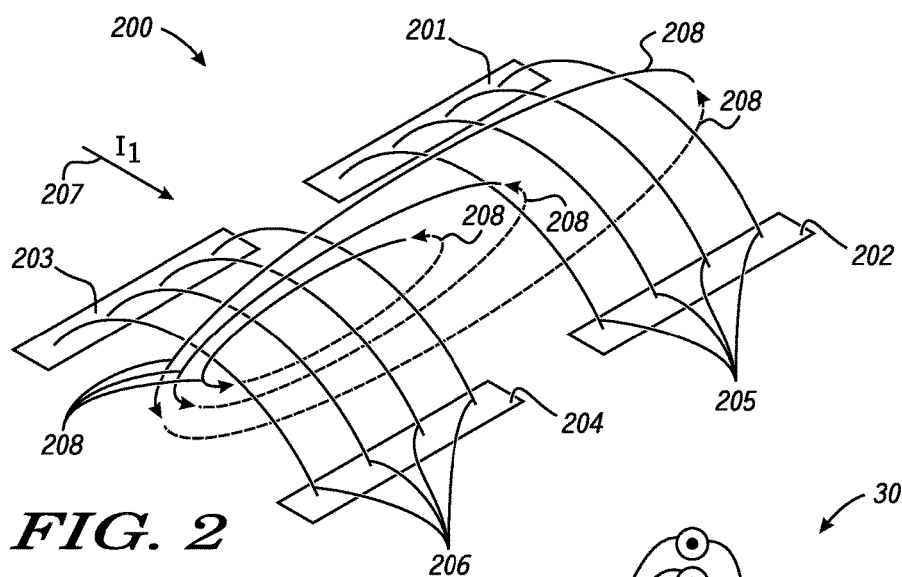
FIG. 2 is a perspective view diagram illustrating wire bond inductors for magnetically coupled load modulation in accordance with an embodiment.

FIG. 2 is a perspective view diagram illustrating wire bond inductors for magnetically coupled load modulation in accordance with an embodiment. Magnetically coupled circuit 200 includes a plurality of bonding wires 205 extending from pad 201 to pad 202 and a plurality of bonding wires 206 extending from pad 203 to pad 204. Bonding wires 205 and 206 are configured in the same direction as each other (e.g., to be approximately parallel to each other). A current 207, referred to as $I_1$, flowing through bonding wires 206 from pad 203 to pad 204 creates a magnetic field 208, referred to as $B_1$, around bonding wires 206. Because of the close proximity of bonding wires 205 to bonding wires 206, bonding wires 205 are also within magnetic field 208. Magnetic field 208 induces a current to flow through bonding wires 205. Thus, bonding wires 205 and 206 are magnetically coupled to each other.

Figure 3:
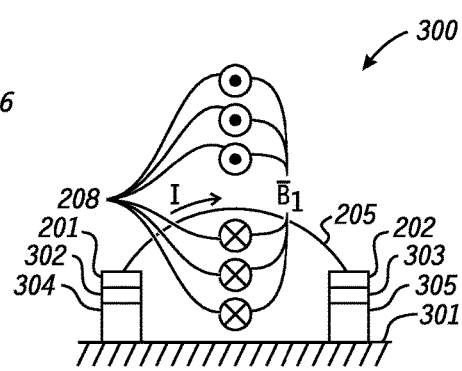
FIG. 3 is a cross sectional view diagram illustrating wire bond inductors for magnetically coupled load modulation in accordance with an embodiment.

FIG. 3 is a cross sectional view diagram illustrating wire bond inductors for magnetically coupled load modulation in accordance with an embodiment. In magnetically coupled circuit 300, a line of magnetic field 208 above bonding wires 205 is shown as coming out of the drawing sheet, and a line of magnetic field 208 below bonding wires 205 is shown a going into the drawing sheet. Pad 201 is disposed on layer 302, which is disposed on layer 304, which is disposed on ground plane 301. Pad 202 is disposed on layer 303, which is disposed on layer 305, which is disposed on ground plane 301. Materials for layers 302, 304, 303, and 305 can be selected to provide the desired electrical properties for pads 201 and 202. For example, by making thinner layer 303 a dielectric material and thicker layer 305 a conductive material, a capacitor, such as capacitor 107 of FIG. 1, can be provided to capacitively compensate for the inductance of the bonding wires 205.

Figure 4:
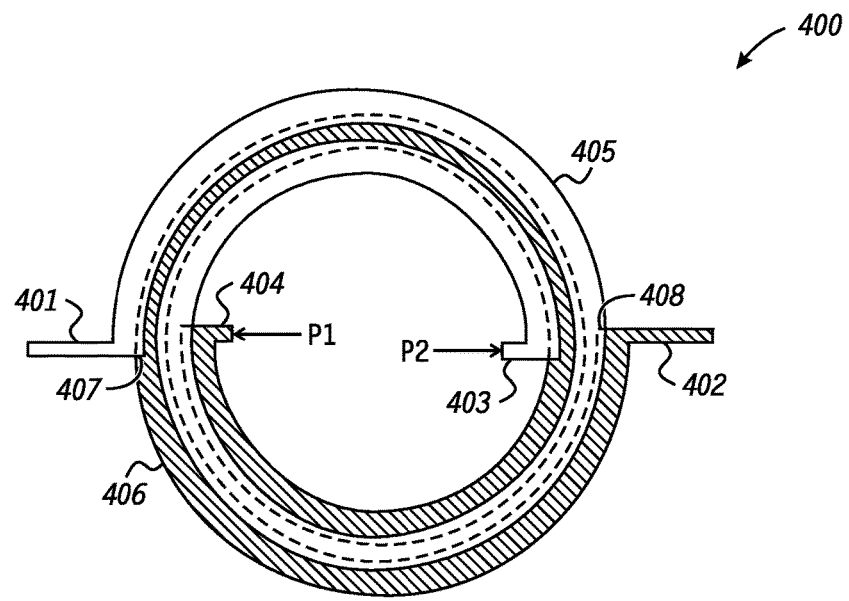
FIG. 4 is a plan view diagram illustrating a combiner implemented using planar conductors for magnetically coupled load modulation in accordance with an embodiment.

FIG. 4 is a plan view diagram illustrating a combiner implemented using planar conductors for magnetically coupled load modulation in accordance with an embodiment. A combiner is a structure having elements that combine multiple RF signals into a single RF signal while providing proper impedance matching and a proper phase relationship. Combiner 400 includes a spiral planar coil 405 in an upper conductive layer of a multilayer structure, such as a multilayer interposer. A multilayer interposer is a multilayer conductive structure disposed between a semiconductor die and the electrical interconnects of the packaged integrated circuit that contains the semiconductor die. A conductive path 401 is connected to an outer end of spiral planar coil 405. A conductive path 403 is connected to an inner end of spiral planar coil 405. Combiner 400 includes a spiral planar coil 406 in a lower conductive layer of the multilayer structure. The upper conductive layer and the lower conductive layer of the multilayer structure are separated by a dielectric layer to insulate the upper conductive layer and the lower conductive layer from each other. A conductive path 402 is connected to an outer end of spiral planar coil 406. A conductive path 404 is connected to an inner end of spiral planar coil 406. The placement of spiral planar coil 405 can be staggered from the placement of spiral planar coil 406 so the area of spiral planar coil 405 which overlies spiral planar coil 406 can be minimized, which can help reduce capacitive coupling between spiral planar coils 405 and 406. As the width of spiral planar coils 405 and 406 can be greater than the spacing between turns of the spiral planar coils 405 and 406, a portion of spiral planar coil 405 can overlie a portion of spiral planar coil 406, and another portion of spiral planar coil 405 can overlie the spacing between turns of spiral planar coil 406.

Figure 5:
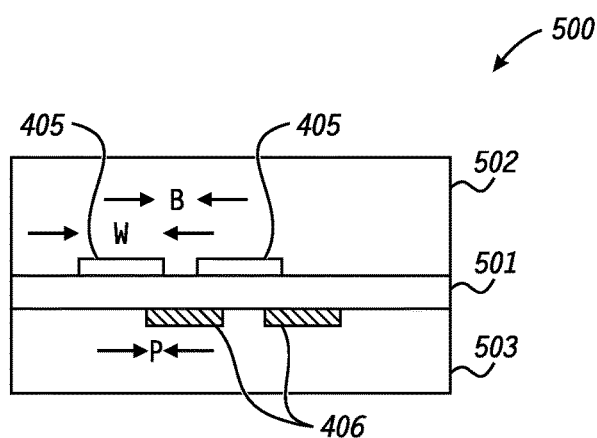
FIG. 5 is a cross sectional view diagram illustrating a combiner implemented using planar conductors for magnetically coupled load modulation in accordance with an embodiment.

FIG. 5 is a cross sectional view diagram illustrating a combiner implemented using planar conductors for magnetically coupled load modulation in accordance with an embodiment. Spiral planar coil 405 lies in a plane of the upper conductive layer on an upper surface of dielectric layer 501. Spiral planar coil 406 lies in a plane on the lower conductive layer of a lower surface of dielectric layer 501. Spiral planar coil 405 has a width w and is spaced from an adjacent turn of spiral planar coil 405 by a spacing s. Spiral planar coil 406 is staggered from spiral planar coil 405. For example, spiral planar coil 406 can be centered over the gap between adjacent turns of spiral planar coil 405. As the width of spiral planar coil 406 is greater than the width of the spacing s between adjacent turns of spiral planar coil 405, an overlap p exists between spiral planar coil 405 and spiral planar coil 406 such that a portion 407 of one turn of spiral planar coil 405 overlies a portion of one turn of spiral planar coil 406 and a portion 408 of another turn of spiral planar coil 405 overlies another portion of the same turn of spiral planar coil 406.

Figure 6:
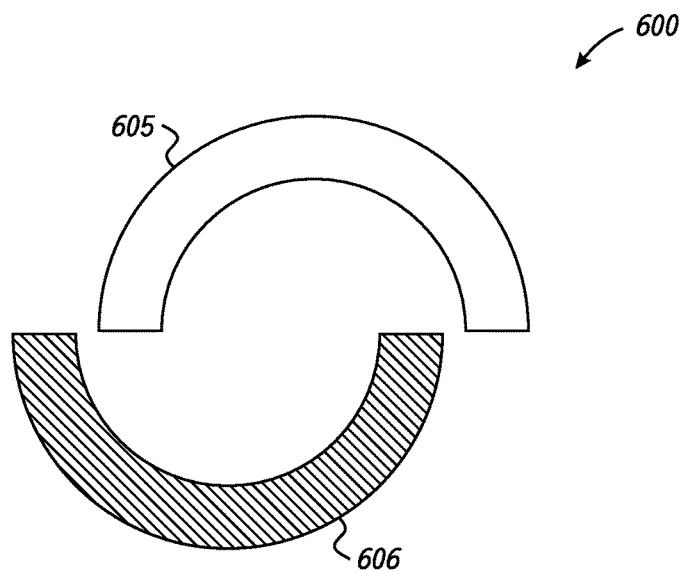
FIG. 6 is a plan view diagram illustrating a combiner implemented using planar conductors for magnetically coupled load modulation in accordance with an embodiment.

FIG. 6 is a plan view diagram illustrating a combiner implemented using planar conductors for magnetically coupled load modulation in accordance with an embodiment. Combiner 600 includes a semicircular planar coil 605 in a lower conductive layer of a multilayer structure, such as a multilayer interposer. Electrical connections can be made to each end of semicircular planar coil 605. Combiner 400 includes a semicircular planar coil 606 in an upper conductive layer of the multilayer structure. The upper conductive layer and the lower conductive layer of the multilayer structure are separated by a dielectric layer to insulate the upper conductive layer and the lower conductive layer from each other. Electrical connections can be made to each end of semicircular planar coil 606. The placement of semicircular planar coil 605 can be staggered from the placement of semicircular planar coil 606 so the area of spiral planar coil 605 which overlies spiral planar coil 606 can be minimized, which can help reduce capacitive coupling between spiral planar coils 605 and 606.

Figure 7:
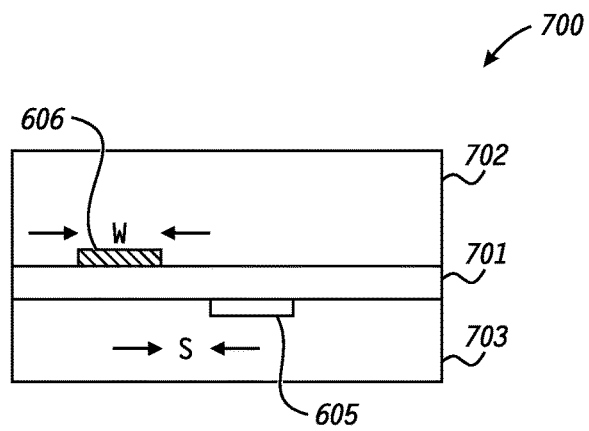
FIG. 7 is a cross sectional view diagram illustrating a combiner implemented using planar conductors for magnetically coupled load modulation in accordance with an embodiment.

FIG. 7 is a cross sectional view diagram illustrating a combiner implemented using planar conductors for magnetically coupled load modulation in accordance with an embodiment. Semicircular planar coil 605 lies in a plane of the lower conductive layer on a lower surface of dielectric layer 701. Semicircular planar coil 606 lies in a plane on the upper conductive layer of an upper surface of dielectric layer 701. Semicircular planar coil 606 has a width w and is spaced horizontally from semicircular planar coil 605 by a spacing s. Semicircular planar coil 606 is staggered from semicircular planar coil 605, which can reduce capacitive coupling between semicircular planar coil 606 and semicircular planar coil 605.

Figure 8:
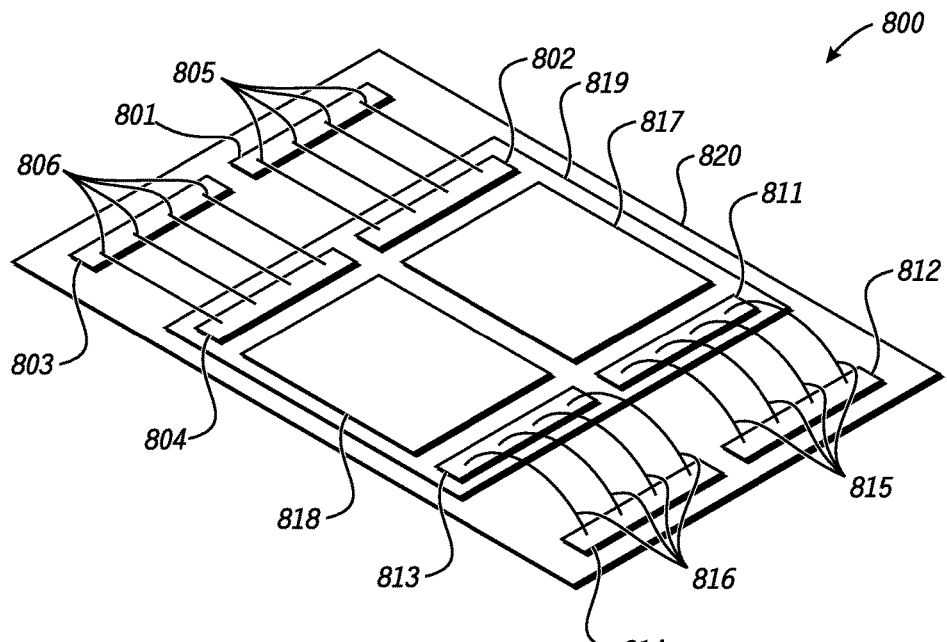
FIG. 8 is a perspective view diagram illustrating a semiconductor device including wire bond inductors for magnetically coupled load modulation in accordance with an embodiment.

FIG. 8 is a perspective view diagram illustrating a semiconductor device including wire bond inductors for magnetically coupled load modulation in accordance with an embodiment. Semiconductor device 800 includes a substrate 820 on which pads 801, 803, 812, and 814 are fabricated. Die 819 overlies a portion of substrate 820. Pads 802, 804, 811, and 813 are fabricated on die 819. Bonding wires 805 connect pad 801 to pad 802. Bonding wires 806 connect pad 803 to pad 804. Bonding wires 815 connect pad 811 to pad 812. Bonding wires 816 connect pad 813 to pad 814. Die 819 includes an active region 817 and an active region 818. Active regions 817 and 818 can implement electronic circuits, for example, amplifier circuits, such as RF amplifiers, which can be RF power amplifiers.

As an example, a main amplifier input signal can be applied to pad 801. Bonding wires 805 convey the main amplifier input signal from pad 801 to pad 802. Pad 802 is connected to an input of a main amplifier implemented in active region 817. An output of the main amplifier is provided to pad 811. Bonding wires 815 convey an output signal from pad 811 to pad 812. A peaking amplifier input signal can be applied to pad 803. Bonding wires 806 convey the peaking amplifier input signal from pad 803 to pad 804. Pad 804 is connected to an input of a peaking amplifier implemented in active region 818. An output of the peaking amplifier is provided to pad 813. Bonding wires 816 convey an output signal from pad 813 to pad 814. In an amplifier context, more current generally flows through output interconnects than through input interconnects. Thus, more energy can be expected to be magnetically coupled between output bonding wires 815 and 816 than between input bonding wires 805 and 806. Also, features such as bonding wire fence shields, spacing of groups of bonding wires, and angles with respect to each other groups of bonding wires are oriented can be used to selectively limit groups of bonding wires among which magnetic coupling occurs. For example, output bonding wires 815 and 816 can be configured to magnetically couple energy between each other, while input bonding wires 805 and 806 can be configured not to magnetically couple energy between each other. Features such as capacitive features can be fabricated at either end of bonding wires 815 and 816 to provide impedance matching for the amplifier outputs.

Figure 9:
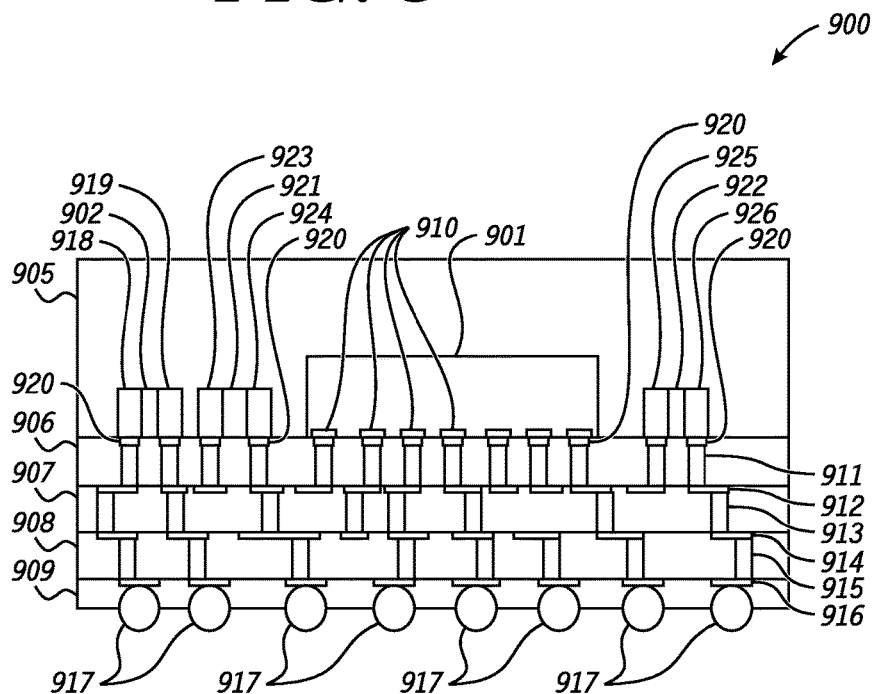
FIG. 9 is an elevation view diagram illustrating a packaged semiconductor device including planar conductors for magnetically coupled load modulation in accordance with an embodiment.

FIG. 9 is an elevation view diagram illustrating a packaged semiconductor device including planar conductors for magnetically coupled load modulation in accordance with an embodiment. Packaged semiconductor device 900 includes at least one semiconductor die 901. The semiconductor die 901 is connected via interconnects 910 to vias 911 of a multilayer interposer. In the illustrated example, the multilayer interposer includes a first layer, a second layer, a third layer, and a fourth layer. The first layer includes a first dielectric layer 906. As an example, the first layer also includes a first conductive layer on an upper surface of first dielectric layer 906. According to such example, conductive features such as pads 920, ends of vias, and paths between pads, vias, and other features are defined in the first conductive layer. As another example, interconnection between features such as terminals 918 and 919 of surface mount technology (SMT) component 902, terminals 923 and 924 of SMT component 921, terminals 925 and 926 of SMT component 922, and features defined in the first conductive layer can be provided by conductive vias deposited in a dielectric layer overlying the first conductive layer and underlying SMT component 902. As an example, such conductive vias can be deposited by plating metal. Such vias can also provide interconnection to other features, such as interconnects 910 for semiconductor die 901, and other electronic components that can be provided, for example, in a planarized embedded assembly of encapsulated electronic circuit elements contained within encapsulant 905. According to such example, vias 911 can extend to interconnects 910, terminals 918 and 919, terminals 923 and 924, and terminals 925 and 926 without the need for pads 920 to be separately provided. The first layer includes vias 911 disposed in holes defined in first dielectric layer 906. The second layer includes a second dielectric layer 907. The second layer also includes a second conductive layer 912. Features such as planar coils, ends of vias, and paths between planar coils, vias, and other features are defined in second conductive layer 907. The second layer further includes vias 913 disposed in holes defined in second dielectric layer 907. The third layer includes a third dielectric layer 908. The third layer also includes a third conductive layer 914. Features such as planar coils, ends of vias, terminal pads, and paths between planar coils, vias, and terminal pads are defined in third conductive layer 914. The third layer further includes vias 915 disposed in holes defined in third dielectric layer 908. The fourth layer includes a fourth dielectric layer 909. The fourth layer also includes a fourth conductive layer 916. Features such as terminal pads, vias, and paths between terminal pads and vias are defined in fourth conductive layer 916. The fourth layer further includes conductive interconnects 917, for example, solder balls, disposed in holes defined in fourth dielectric layer 909. Where conductive elements of, for example, a lower surface of one layer, are in contact with conductive elements of, for example, an upper surface of a directly underlying layer, an electrical connection from the overlying layer to the underlying layer is provided. Where a non-conductive element, such as a dielectric layer, separates conductive elements, no electrical connection is provided along at least the non-conductively separated portions of the conductive elements.

Packaged semiconductor device 900 of FIG. 9 can include other circuit features in the planarized encapsulated assembly of electronic circuit elements, and such features can be connected to vias 911. Elements of the packaged semiconductor device, such as semiconductor die 901 and SMT components 902, 921, and 922 can be encapsulated in an encapsulant 905 (such as an epoxy) to house and provide environmental protection for such elements. It is noted that, to more clearly illustrate details, FIG. 9 is not drawn to scale.

Referring back to FIGS. 4-7, magnetically coupled structures can be fabricated by defining the pattern of a first planar conductive layer to provide connection to features such as semiconductor die 901, and SMT components 902, 921, and 922 as the first conductive layer, by defining the pattern of second planar conductive layer, in which features such as spiral planar coil 405, shown in FIGS. 4 and 5, or semicircular planar coil 606, as shown in FIGS. 6 and 7, as second conductive layer 912, shown in FIG. 9, and by defining the pattern of third planar conductive layer, in which features such as a spiral planar coil 406, shown in FIGS. 4 and 5, or semicircular planar coil 605, shown in FIGS. 6 and 7, as third conductive layer 914, shown in FIG. 9. Vias between the first planar conductive layer and the second planar conductive layer can be implemented using vias 911, shown in FIG. 9. Vias between the second planar conductive layer and the third planar conductive layer can be implemented using vias 913, shown in FIG. 9. Thus, magnetically coupled structures can be implemented in a multilayer interposer between a semiconductor die 901 and conductive interconnects 917 within packaged integrated circuit 900.

While elements may be described as overlying or underlying other elements, it should be understood that such terms are used with respect to a particular integrated circuit package orientation and that other integrated circuit package orientations may be practiced without departing from the described relationships. For example, as shown in FIGS. 4 and 5, portions of spiral planar coil 406 underlie portions of spiral planar coil 405. As shown in FIG. 9, encapsulant 905 overlies semiconductor die 901 and SMT components 902, 921, 922, which overlie a first layer of the multilayer interposer, which overlies a second layer of the multilayer interposer, which overlies a third layer of the multilayer interposer, which overlies conductive interconnects 917 of the packaged integrated circuit 900. It should be understood that, for example, if packaged integrated circuit 900 were oriented to be inverted relative to its orientation shown in FIG. 9, the relationships between the described succession of elements overlying one another would not physically differ despite the different orientation.

Figure 10:
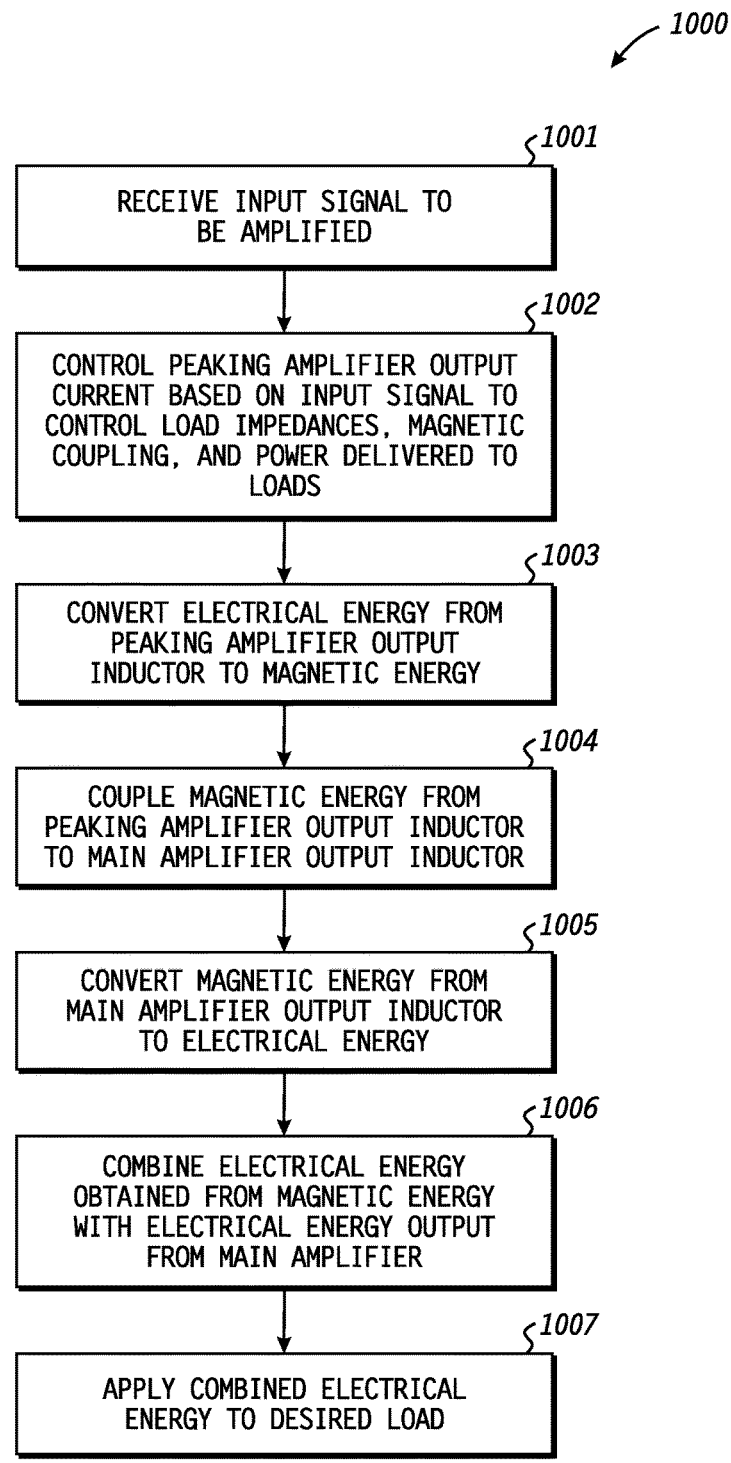
FIG. 10 is a flow diagram illustrating a method for magnetically coupled load modulation in accordance with an embodiment.

FIG. 10 is a flow diagram illustrating a method for magnetically coupled load modulation in accordance with an embodiment. Method 1000 begins in block 1001, where an input signal to be amplified is received. From block 1001, method 1000 continues to block 1002. In block 1002, a peaking amplifier output current is controlled based on an input signal to control load impedances, magnetic coupling, and power delivered to loads. From block 1002, method 1000 continues to block 1003. In block 1003, electrical energy from a peaking amplifier output and flowing through a peaking amplifier output inductor is converted to magnetic energy. From block 1003, method 1000 continues to block 1004. In block 1004, the magnetic energy is magnetically coupled from the peaking amplifier output inductor to a main amplifier output inductor. From block 1004, method 1000 continues to block 1005. In block 1005, magnetic energy impinging upon the main amplifier output inductor is converted by the main amplifier output inductor to electrical energy. The electrical energy flows through the main amplifier output inductor and changes characteristics of the main amplifier output inductor, such as the impedance which the main amplifier output inductor presents to the main amplifier output. From block 1005, method 1000 continues to block 1006. In block 1006, electrical energy obtained from magnetic energy by the main amplifier output inductor is combined with electrical energy output from the main amplifier at the main amplifier output. From block 1006, method 1000 continues to block 1007. In block 1007, the combined electrical energy is applied to a desired load. For example, the combined electrical energy can be applied to an antenna for wireless transmission.

Figure 11:
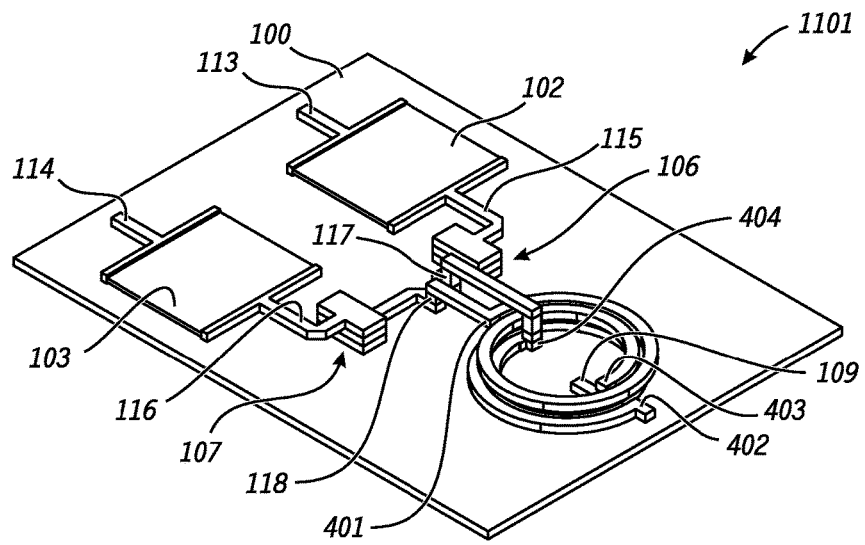
FIG. 11 is a perspective view illustrating a semiconductor device including a combiner implemented using planar conductors for magnetically coupled load modulation in accordance with an embodiment.
Figure 12:
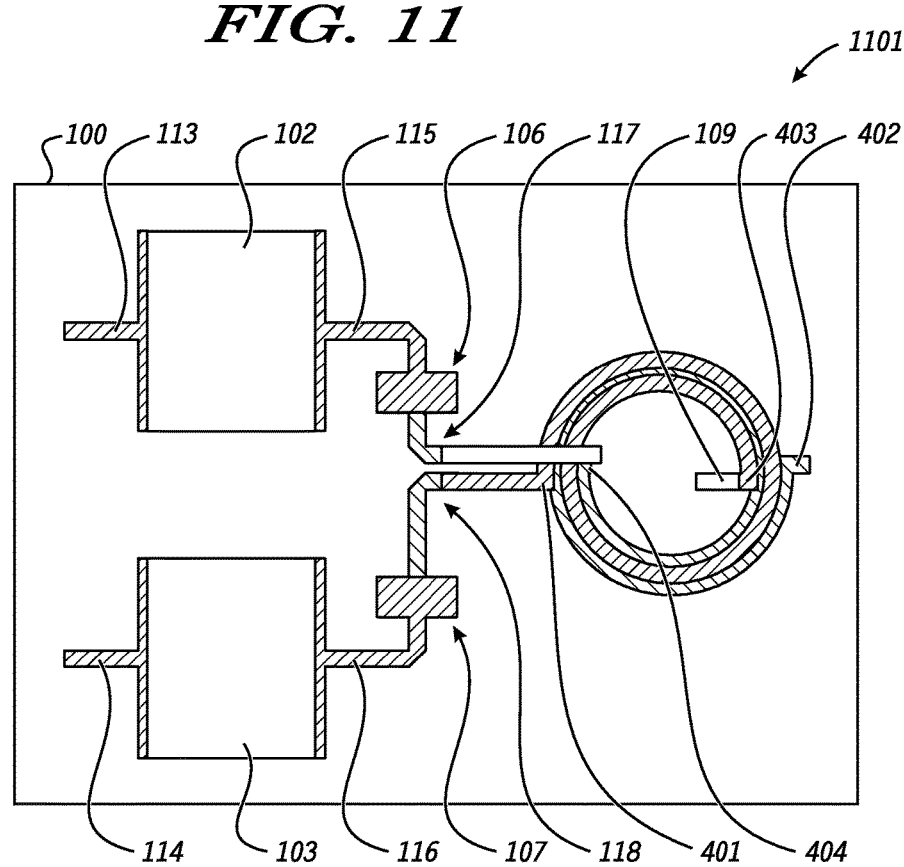
FIG. 12 is a plan view illustrating the semiconductor device of FIG. 11 including a combiner implemented using planar conductors for magnetically coupled load modulation in accordance with an embodiment.

FIG. 11 is a perspective view and FIG. 12 is a plan view, both of which illustrate a semiconductor device including a combiner implemented using planar conductors for magnetically coupled load modulation in accordance with an embodiment. Semiconductor device 1101 comprises RF circuit 100. RF circuit 100 includes a RF PA 102, a RF PA 103, a capacitor 106, a capacitor 107, a combiner 400, and a load 109. A first amplifier input signal is provided at a first amplifier input 113, and a second amplifier input signal is provided at a second amplifier input. The first amplifier input 113 is connected to an input of first RF PA 102 to provide the first amplifier input signal to first RF PA 102. The second amplifier input 114 is connected to an input of second RF PA 103 to provide the second amplifier input signal to second RF PA 103.

First RF PA 102 amplifies the first amplifier input signal to provide a first amplifier output signal at first amplifier output 115. Second RF PA 103 amplifies the second amplifier input signal to provide a second amplifier output signal at second amplifier output 116. First amplifier output 115 is connected to a first terminal of a first capacitor 106. Second amplifier output 116 is connected to a first terminal of a second capacitor 107. A second terminal of first capacitor 106 is connected to node 117. A second terminal of second capacitor 107 is connected to node 118. Combiner 400 is as described with respect to FIG. 4. Node 117 is connected to conductive path 404 of combiner 400. Node 118 is connected to conductive path 401 of combiner 400. Conductive path 403 of combiner 400 is connected to a first terminal of load 109, which may, for example, be an open quarter-wave transmission line. Conductive path 402 of combiner 400 provides an RF output terminal that may be connected externally to load 108.

Substantial amounts of power, such as at the outputs of RF power transistor devices, involve passing substantial amounts of current through conductors in close physical proximity, such as through the paths of output bond wire arrays, which create substantial magnetic fields. Multiple RF paths in a single package can accentuate magnetic coupling between such paths. Such coupling can be used to change the impedance as seen from within the coupled path. Such coupling can be used to provide load modulation of a load within the coupled path. For example, the magnetic coupling can be used to form an impedance inverter such that one path can be operated analogous to a main amplifier in a Doherty power amplifier configuration based on coupling from another path operated analogous to a peaking amplifier in the Doherty power amplifier configuration.

In accordance with one embodiment, a reduced physical size Doherty power amplifier can be implemented in a single package with higher performance including immunity to detrimental magnetic coupling of the output paths by configuring the magnetic coupling to provide Doherty modulation in an amplifier system having multiple gain elements in parallel operating at different phase angles. By so configuring the magnetic coupling, high efficiency can be obtained over a wide range of instantaneous power levels and over a wide range of frequencies, which facilitates implementation of a wideband amplifier system for signals having a high peak to average power ratio (PAPR), for example, orthogonal frequency division multiplexed (OFDM) signals.

In accordance with one embodiment, a Doherty power amplifier with dual outputs (e.g., path A & path B) that magnetically couple energy from an output of a path B gain element to load modulate the output of a path A gain element. The dual outputs are used to drive two loads. The loads need not be similar. For example, the loads can be extremely asymmetric, where for example, at least 90 percent of the energy from the path B gain element is magnetically coupled to the path A load. As another example, at least 95 percent of the energy from the path B gain element is magnetically coupled to the path A load. As yet another example, at least 98 percent of the energy from the path B gain element is magnetically coupled to the path A load. As a further example, at least 99 percent of the energy from the path B gain element is magnetically coupled to the path A load. In accordance with one embodiment, the magnetic coupling output combiner can operate over a significant RF bandwidth and can provide higher broadband RF performance as compared with a conventional Doherty amplifier.

In accordance with one embodiment, a magnetically coupled amplifier subsystem can include two RF paths which each include an active transistor (which can be modeled as a current source) which can be driven with arbitrary amplitude and phase and an inductive connection to a load. The inductive connections to each load are in close proximity to each other such that the varying magnetic field of one path induces a voltage in the other path. With careful design, this induced voltage provides an impedance shift (e.g., load modulation) that is dependent on the intensity of the coupled magnetic field.

In accordance with one embodiment, series reactance that cancels the self inductance of the inductive elements in the magnetically coupled output paths of the amplifier gain elements can be used to determine a value for resonant series capacitors. The resonant series capacitors can be added, for one or both paths, either before or after the magnetic coupling inductors to provide impedance matching.

In accordance with one embodiment, a quarterwave transmission line used in a conventional Doherty amplifier output combiner can be avoided. As a quarterwave transmission line has a length that is a function of frequency, a quarter-wave transmission line can limit bandwidth over which the output combiner operates. By avoiding use of a quarterwave transmission line, at least one embodiment can provide a wider bandwidth output combiner than is possible with conventional Doherty amplifier output combiners.

In accordance with one embodiment, a magnetically coupled output combiner can be applied to RF power amplifier products. As an example, a magnetically coupled output combiner can be configured to operate over a broad frequency range in the gigahertz range. For example, a magnetically coupled output combiner can be configured to operate two to three gigahertz.

In accordance with one embodiment, a method includes receiving an input signal to be amplified, controlling a secondary amplifier output current of a secondary RF amplifier gain element based on the input signal received at an amplifier input, converting electrical energy to magnetic energy at a secondary amplifier output inductor to which the secondary amplifier output current is provided, coupling the magnetic energy from the secondary amplifier output inductor to a primary amplifier output inductor, converting the coupled magnetic energy to induced electrical energy at the primary amplifier output inductor, combining the induced electrical energy with output electrical energy from a primary RF amplifier gain element, and applying a combined electrical energy including the output electrical energy and the induced electrical energy to a primary amplifier load. In accordance with one embodiment, the combining the induced electrical energy with the output electrical energy from the primary RF amplifier gain element further includes modulating a primary amplifier load impedance of the primary amplifier load as a function of the induced electrical energy. In accordance with one embodiment, the modulating includes modulating the primary amplifier load impedance according to an equation $Z_m = j\omega L + R_m + jX_m + j\omega M(I_p/I_m)$, where $Z_m$ equals the primary amplifier load impedance, j equals the square root of negative one, $\omega$ equals two times pi times a frequency of operation, L equals a self inductance of the primary amplifier output inductor, $R_m$ equals a primary amplifier load resistance of the primary amplifier load, $X_m$ equals a primary amplifier output capacitive reactance, M equals a mutual inductance, $I_p$ equals a secondary amplifier output current, and $I_m$ equals a primary amplifier output current. $I_p$ and $I_m$ may be vectors, which can be mathematically complex. In accordance with one embodiment, the converting the electrical energy to the magnetic energy at the secondary amplifier output inductor further includes providing impedance inversion of a secondary amplifier load impedance of the secondary RF amplifier gain element. In accordance with one embodiment, the combining the induced electrical energy with the output electrical energy from the primary RF amplifier gain element includes combining the induced electrical energy with the output electrical energy output without a quarter-wave combiner, wherein a Doherty amplifier includes the primary RF amplifier gain element outputting the output electrical energy and the secondary RF amplifier gain element outputting the output electrical energy. In accordance with one embodiment, the Doherty amplifier is an inverted Doherty amplifier. In accordance with one embodiment, the Doherty amplifier is a symmetric Doherty amplifier. In accordance with one embodiment, the Doherty amplifier is an asymmetric Doherty amplifier.

In accordance with one embodiment, the method further includes configuring the primary amplifier output inductor and the secondary amplifier output inductor to have a maximum separation of 40 mils. In accordance with one embodiment, the method includes implementing the primary amplifier output inductor as a first set of bonding wires and implementing the secondary amplifier output inductor as a second set of bonding wires, the second set of bonding wires being oriented to be magnetically coupled to the first set of bonding wires. In accordance with one embodiment, the first set of bonding wires and the second set of bonding wires are substantially parallel. In accordance with one embodiment, the first set of bonding wires and the second set of bonding wires are substantially parallel and both are arched in a similar direction. In accordance with one embodiment, the first set of bonding wires and the second set of bonding wires are substantially parallel, with the first set of bonding wires arching in a first direction and the second set of bonding wires arching in a second direction opposite the first direction.

In accordance with one embodiment, the method further includes configuring the primary amplifier output inductor and the secondary amplifier output inductor as arcuate planar coils. In accordance with one embodiment, the method includes configuring the primary amplifier output inductor and the secondary amplifier output inductor as spiral planar coils. In accordance with one embodiment, the spiral planar coils are stacked on different layers of a multilayer structure. In accordance with one embodiment, the stacked spiral planar coils are staggered from each other. In accordance with one embodiment, the method includes configuring the primary amplifier output inductor and the secondary amplifier output inductor as semicircular planar coils. In accordance with one embodiment, the semicircular planar coils are stacked on different layers of a multilayer structure. In accordance with one embodiment, the semicircular planar coils are oriented in opposite directions from each other. In accordance with one embodiment, the semicircular planar coils are staggered from each other.

In accordance with one embodiment, a packaged semiconductor device includes a primary RF amplifier gain element, a primary amplifier output inductor electrically coupled to the primary RF amplifier gain element, a primary amplifier load electrically coupled to the primary amplifier output inductor, a secondary RF amplifier gain element, a secondary amplifier output inductor electrically coupled to the secondary RF amplifier gain element and magnetically coupled to the primary amplifier output inductor, and a secondary amplifier load electrically coupled to the secondary amplifier output inductor, wherein the secondary amplifier output inductor magnetically couples a majority of a secondary amplifier output power of the secondary RF amplifier gain element to the primary amplifier output inductor to be applied to the primary amplifier load. In accordance with one embodiment, the secondary amplifier output inductor modulates a primary amplifier output inductor impedance of the primary amplifier output inductor via magnetic coupling as a function of a secondary amplifier output of the secondary RF amplifier gain element. In accordance with one embodiment, a primary amplifier output impedance presented to the primary amplifier output of the primary RF gain element conforms to an equation $Z_m = j\omega L + R_m + jX_m + j\omega M(I_p/I_m)$, where $Z_m$ equals the primary amplifier load impedance, j equals the square root of negative one, $\omega$ equals two times pi times a frequency of operation, L equals a self inductance of the primary amplifier output inductor, $R_m$ equals a primary amplifier load resistance of the primary amplifier load, $X_m$ equals a primary amplifier output capacitive reactance, M equals a mutual inductance, $I_p$ equals a secondary amplifier output current, and $I_m$ equals a primary amplifier output current. $I_p$ and $I_m$ may be vectors, which can be mathematically complex. By controlling a relationship between $I_p$ and $I_m$, the load impedance presented to the primary amplifier can be controlled. By modulating $I_p$ relative to $I_m$, load modulation can be provided for the primary amplifier by the secondary amplifier. The load modulation of the primary amplifier by the secondary amplifier can effectively implement a combiner suitable for a Doherty amplifier without the need for traditional Doherty amplifier combiner elements that can limit performance (e.g., bandwidth), such as a quarter-wave transmission line coupling section connected to a combining point of the traditional Doherty amplifier combiner where two paths of the traditional Doherty amplifier combiner are conductively connected. By utilizing amplifier output inductors having broadband frequency response, a broadband magnetically coupled combiner can be provided. As combiner bandwidth often limits Doherty amplifier bandwidth, a broadband magnetically coupled combiner can enable implementation of a broadband Doherty amplifier. The term "broadband," as used herein, means a frequency response within +/−3 decibels (dB) over a range with a ratio of the lowest frequency of the range to the highest frequency of the range of at least two. As examples, such ratio can have a value of at least 2, 2.5, 3, 3.5, 4, 5, 6, 7, 8, 9, or 10. In accordance with one embodiment, the secondary amplifier output inductor, in conjunction with the primary amplifier output inductor, functions as an impedance inverter. In accordance with one embodiment, a Doherty amplifier includes the primary RF amplifier gain element and the secondary RF amplifier gain element. In accordance with one embodiment, the Doherty amplifier does not include a quarter-wave combiner at the outputs of the first amplifier gain element and the second amplifier gain element. In accordance with one embodiment, the Doherty amplifier is an inverted Doherty amplifier. In accordance with one embodiment, the Doherty amplifier is a symmetric Doherty amplifier. In accordance with one embodiment, the Doherty amplifier is an asymmetric Doherty amplifier.

In accordance with one embodiment, the primary amplifier output inductor and the secondary amplifier output inductor have a maximum separation of 40 mils. In accordance with one embodiment, the primary amplifier output inductor is a first set of bonding wires and the secondary amplifier output inductor is a second set of bonding wires, the second set of bonding wires being oriented to be magnetically coupled to the first set of bonding wires. In accordance with one embodiment, the first set of bonding wires and the second set of bonding wires are substantially parallel. In accordance with one embodiment, the first set of bonding wires and the second set of bonding wires are substantially parallel and both are arched in a similar direction. In accordance with one embodiment, the first set of bonding wires and the second set of bonding wires are substantially parallel, with the first set of bonding wires arching in a first direction and the second set of bonding wires arching in a second direction opposite the first direction.

In accordance with one embodiment, the primary amplifier output inductor and the secondary amplifier output inductor are arcuate planar coils. In accordance with one embodiment, the primary amplifier output inductor and the secondary amplifier output inductor are spiral planar coils. In accordance with one embodiment, the spiral planar coils are stacked on different layers of a multilayer structure. In accordance with one embodiment, the stacked spiral planar coils are staggered from each other. In accordance with one embodiment, the method includes configuring the primary amplifier output inductor and the secondary amplifier output inductor as semicircular planar coils. In accordance with one embodiment, the semicircular planar coils are stacked on different layers of a multilayer structure. In accordance with one embodiment, the semicircular planar coils are oriented in opposite directions from each other. In accordance with one embodiment, the semicircular planar coils are staggered from each other.

In accordance with one embodiment, a system includes a signal input, a phase adjustment circuit coupled to the signal input for receiving a radio frequency (RF) input signal, a primary RF amplifier gain element coupled to the phase adjustment circuit for receiving a first instance having a first phase of an RF signal, a secondary RF amplifier gain element coupled to the phase adjustment circuit for receiving a second instance having a second phase of the RF signal, a primary amplifier output inductor electrically coupled to a primary amplifier output of the primary RF amplifier gain element, a primary amplifier load electrically coupled to the primary amplifier output inductor, a secondary amplifier output inductor electrically coupled to a secondary amplifier output of the secondary RF amplifier gain element and magnetically coupled to the primary amplifier output inductor, and a secondary amplifier load electrically coupled to the secondary amplifier output inductor, wherein the secondary amplifier output inductor magnetically couples a majority of a secondary amplifier output power of the secondary RF amplifier gain element to the primary amplifier output inductor to be applied to the primary amplifier load.

In accordance with one embodiment, the secondary amplifier output inductor modulates a primary amplifier output inductor impedance of the primary amplifier output inductor via magnetic coupling as a function of a secondary amplifier output of the secondary RF amplifier gain element. In accordance with one embodiment, a secondary amplifier output current is controlled to modify the impedance of the primary amplifier output inductor.

In accordance with one embodiment, a primary amplifier output impedance presented to the primary amplifier output conforms to an equation $Z_m = j\omega L + R_m + jX_m + j\omega M(I_p/I_m)$, where $Z_m$ equals the primary amplifier load impedance, j equals the square root of negative one, $\omega$ equals two times pi times a frequency of operation, L equals a self inductance of the primary amplifier output inductor, $R_m$ equals a primary amplifier load resistance of the primary amplifier load, $X_m$ equals a primary amplifier output capacitive reactance, M equals a mutual inductance, $I_p$ equals a secondary amplifier output current, and $I_m$ equals a primary amplifier output current. $I_p$ and $I_m$ may be vectors, which can be mathematically complex.

In accordance with one embodiment, the secondary amplifier output inductor, in conjunction with the primary amplifier output inductor, functions as an impedance inverter.

In accordance with one embodiment, a Doherty amplifier includes the primary RF amplifier gain element and the secondary RF amplifier gain element. In accordance with one embodiment, the Doherty amplifier does not include a quarter-wave combiner at the outputs of the first amplifier gain element and the second amplifier gain element. In accordance with one embodiment, the Doherty amplifier is an inverted Doherty amplifier. In accordance with one embodiment, the Doherty amplifier is a symmetric Doherty amplifier. In accordance with one embodiment, the Doherty amplifier is an asymmetric Doherty amplifier.

In accordance with one embodiment, the primary amplifier output inductor and the secondary amplifier output inductor are arcuate planar coils. In accordance with one embodiment, the primary amplifier output inductor and the secondary amplifier output inductor are spiral planar coils. In accordance with one embodiment, the spiral planar coils are stacked on different layers of a multilayer structure. In accordance with one embodiment, the stacked spiral planar coils are staggered from each other. In accordance with one embodiment, the method includes configuring the primary amplifier output inductor and the secondary amplifier output inductor as semicircular planar coils. In accordance with one embodiment, the semicircular planar coils are stacked on different layers of a multilayer structure. In accordance with one embodiment, the semicircular planar coils are oriented in opposite directions from each other. In accordance with one embodiment, the semicircular planar coils are staggered from each other.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
    controlling a secondary amplifier output current of a secondary radio frequency (RF) amplifier gain element based on an input signal received from an amplifier input;
    providing the secondary amplifier output current to a secondary amplifier output inductor to convert electrical energy to magnetic energy;
    coupling the magnetic energy from the secondary amplifier output inductor to a primary amplifier output inductor, wherein the coupled magnetic energy is converted to induced electrical energy at the primary amplifier output inductor;
    combining the induced electrical energy with output electrical energy from a primary RF amplifier gain element;
    applying a combined electrical energy including the output electrical energy and the induced electrical energy to a primary amplifier load; and
    wherein the combining the induced electrical energy with the output electrical energy from the primary RF amplifier gain element further comprises modulating a primary amplifier load impedance of the primary amplifier load as a function of the induced electrical energy.

2. The method of claim 1 wherein the modulating comprises:
    modulating the primary amplifier load impedance according to an equation $Z_m = j\omega L + R_m + jX_m + j\omega M(I_p/I_m)$, where $Z_m$ equals the primary amplifier load impedance, j equals the square root of negative one, $\omega$ equals two times pi times a frequency of operation, L equals a self inductance of the primary amplifier output inductor, $R_m$ equals a primary amplifier load resistance of the primary amplifier load, $X_m$ equals a primary amplifier output capacitive reactance, M equals a mutual inductance, $I_p$ equals a secondary amplifier output current, and $I_m$ equals a primary amplifier output current.

3. A method comprising:
    controlling a secondary amplifier output current of a secondary radio frequency (RF) amplifier gain element based on an input signal received from an amplifier input;
    providing the secondary amplifier output current to a secondary amplifier output inductor to convert electrical energy to magnetic energy;
    coupling the magnetic energy from the secondary amplifier output inductor to a primary amplifier output inductor, wherein the coupled magnetic energy is converted to induced electrical energy at the primary amplifier output inductor;

combining the induced electrical energy with output electrical energy from a primary RF amplifier gain element;
applying a combined electrical energy including the output electrical energy and the induced electrical energy to a primary amplifier load; and
wherein the converting the electrical energy to the magnetic energy at the secondary amplifier output inductor further comprises: providing impedance inversion of a secondary amplifier load impedance of the secondary RF amplifier gain element.

4. The method of claim 1 wherein the combining the induced electrical energy with the output electrical energy from the primary RF amplifier gain element comprises:
combining a main amplifier output signal with a peaking amplifier output signal, wherein a Doherty amplifier comprises the primary RF amplifier gain element outputting the output electrical energy and the secondary RF amplifier gain element outputting the output electrical energy.

5. The method of claim 1 further comprising:
configuring the primary amplifier output inductor and the secondary amplifier output inductor to have a maximum separation of 40 mils.

6. The method of claim 1 further comprising:
configuring the primary amplifier output inductor and the secondary amplifier output inductor as arcuate planar coils.

7. A packaged semiconductor device comprising:
a primary radio frequency (RF) amplifier gain element;
a primary amplifier output inductor electrically coupled to the primary RF amplifier gain element;
a primary amplifier load electrically coupled to the primary amplifier output inductor;
a secondary RF amplifier gain element;
a secondary amplifier output inductor electrically coupled to the secondary RF amplifier gain element and magnetically coupled to the primary amplifier output inductor; and
a secondary amplifier load electrically coupled to the secondary amplifier output inductor, wherein the secondary amplifier output inductor magnetically couples a majority of a secondary amplifier output power of the secondary RF amplifier gain element to the primary amplifier output inductor to be applied to the primary amplifier load.

8. The packaged semiconductor device of claim 7 wherein the secondary amplifier output inductor modulates a primary amplifier output inductor impedance of the primary amplifier output inductor via magnetic coupling as a function of a secondary amplifier output of the secondary RF amplifier gain element.

9. The packaged semiconductor device of claim 7 wherein a primary amplifier gain element output impedance presented to a primary amplifier output of the primary RF amplifier gain element conforms to an equation $Z_m = j\omega L + R_m + jX_m + j\omega M(I_p/I_m)$, where $Z_m$ equals the primary amplifier load impedance, j equals the square root of negative one, $\omega$ equals two times pi times a frequency of operation, L equals a self inductance of the primary amplifier output inductor, Rm equals a primary amplifier load resistance of the primary amplifier load, $X_m$ equals a primary amplifier output capacitive reactance, M equals a mutual inductance, $I_p$ equals a secondary amplifier output current, and $I_m$ equals a primary amplifier output current.

10. The packaged semiconductor device of claim 7 wherein the secondary amplifier output inductor, in conjunction with the primary amplifier output inductor, functions as an impedance inverter.

11. The packaged semiconductor device of claim 7 wherein a Doherty amplifier comprises the primary RF amplifier gain element and the secondary RF amplifier gain element.

12. The packaged semiconductor device of claim 7 wherein the primary amplifier output inductor and the secondary amplifier output inductor have a maximum separation of 40 mils.

13. The packaged semiconductor device of claim 7 wherein the primary amplifier output inductor and the secondary amplifier output inductor are arcuate planar coils.

14. A system comprising:
a signal input;
a phase adjustment circuit coupled to the signal input for receiving a radio frequency (RF) input signal;
a primary RF amplifier gain element coupled to the phase adjustment circuit for receiving a first instance having a first phase of an RF signal;
a secondary RF amplifier gain element coupled to the phase adjustment circuit for receiving a second instance having a second phase of the RF signal;
a primary amplifier output inductor electrically coupled to a primary amplifier output of the primary RF amplifier gain element;
a primary amplifier load electrically coupled to the primary amplifier output inductor;
a secondary amplifier output inductor electrically coupled to a secondary amplifier output of the secondary RF amplifier gain element and magnetically coupled to the primary amplifier output inductor; and
a secondary amplifier load electrically coupled to the secondary amplifier output inductor, wherein the secondary amplifier output inductor magnetically couples a majority of a secondary amplifier output power of the secondary RF amplifier gain element to the primary amplifier output inductor to be applied to the primary amplifier load.

15. The system of claim 14 wherein the secondary amplifier output inductor modulates a primary amplifier output inductor impedance of the primary amplifier output inductor via magnetic coupling as a function of a secondary amplifier output of the secondary RF amplifier gain element.

16. The system of claim 14 wherein a primary amplifier output impedance presented to the primary amplifier output conforms to an equation $Z_m = j\omega L + R_m + jX_m + j\omega M(I_p/I_m)$, where $Z_m$ equals the primary amplifier load impedance, j equals the square root of negative one, $\omega$ equals two times pi times a frequency of operation, L equals a self inductance of the primary amplifier output inductor, Rm equals a primary amplifier load resistance of the primary amplifier load, $X_m$ equals a primary amplifier output capacitive reactance, M equals a mutual inductance, $I_p$ equals a secondary amplifier output current, and $I_m$ equals a primary amplifier output current.

17. The system of claim 14 wherein the secondary amplifier output inductor, in conjunction with the primary amplifier output inductor, functions as an impedance inverter.

18. The system of claim 14 wherein a Doherty amplifier comprises the primary RF amplifier gain element and the secondary RF amplifier gain element.

19. The system of claim 14 wherein the primary amplifier output inductor and the secondary amplifier output inductor are arcuate planar coils.

\* \* \* \* \*